United States Patent
Coburn et al.

(10) Patent No.: US 8,937,687 B2
(45) Date of Patent: Jan. 20, 2015

(54) SYSTEMS AND METHODS FOR GRAPHICAL CONTROL OF SYMBOL-BASED FEATURES IN A TELEVISION RECEIVER

(75) Inventors: Matthew Coburn, Denver, CO (US); Karen Michelle Taxier, Highlands Ranch, CO (US); James Matthew White, Denver, CO (US); Luke Vanduyn, Highlands Ranch, CO (US); Daniel L. Rudolph, Castle Rock, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 884 days.

(21) Appl. No.: 12/241,604

(22) Filed: Sep. 30, 2008

(65) Prior Publication Data

US 2010/0079681 A1 Apr. 1, 2010

(51) Int. Cl.
| | |
|---|---|
| H03J 1/00 | (2006.01) |
| H04N 5/44 | (2011.01) |
| H04N 5/445 | (2011.01) |
| H04N 21/422 | (2011.01) |
| H04N 21/431 | (2011.01) |
| H04N 21/482 | (2011.01) |

(52) U.S. Cl.
CPC ............ H03J 1/0025 (2013.01); H04N 5/4403 (2013.01); H04N 5/44543 (2013.01); H04N 21/422 (2013.01); H04N 21/42204 (2013.01); H04N 21/4316 (2013.01); H04N 21/482 (2013.01); H04N 2005/4408 (2013.01); H04N 2005/443 (2013.01); H04N 2005/4441 (2013.01)
USPC ....................................................... 348/734

(58) Field of Classification Search
USPC .......... 348/734, 745, 731, 569–570; 345/168, 345/158; 725/131, 58, 47, 43, 38, 46; 386/213; 707/723
See application file for complete search history.

(56) References Cited

U.S. PATENT DOCUMENTS

| | | |
|---|---|---|
| 4,450,477 A | 5/1984 | Lovett |
| 4,725,888 A | 2/1988 | Hakamada |

(Continued)

FOREIGN PATENT DOCUMENTS

| | | |
|---|---|---|
| EP | 1063797 A2 | 12/2000 |
| EP | 1158793 A2 | 11/2001 |

(Continued)

OTHER PUBLICATIONS

International Searching Authority, European Patent Office, "International Search Report," mailed Dec. 7, 2009; International Application No. PCT/US2009/058457, filed Sep. 25, 2009.

(Continued)

*Primary Examiner* — Jeffery Harold
*Assistant Examiner* — Sihar Karwan
(74) *Attorney, Agent, or Firm* — Ingrassia Fisher & Lorenz, P.C.

(57) ABSTRACT

Systems and methods provide for graphically controlling numeric, alphanumeric or other symbol-based features on a set top box (STB) or other television receiver. A keypad image is presented on the display that includes key images corresponding to the symbol-based features. A two-dimensional input is received from the remote control that indicates one of the key images, and imagery on the display is updated in response to the received two-dimensional input.

13 Claims, 4 Drawing Sheets

(56) References Cited

U.S. PATENT DOCUMENTS

| | | | |
|---|---|---|---|
| 4,739,510 A | 4/1988 | Jeffers et al. |
| 4,852,019 A | 7/1989 | Vinberg et al. |
| 4,868,785 A | 9/1989 | Jordan et al. |
| 5,187,776 A | 2/1993 | Yanker |
| 5,260,778 A | 11/1993 | Kauffman et al. |
| 5,428,734 A | 6/1995 | Haynes et al. |
| 5,438,372 A | 8/1995 | Tsumori et al. |
| 5,450,536 A | 9/1995 | Rusenberg et al. |
| 5,453,796 A | 9/1995 | Duffield et al. |
| 5,539,478 A | 7/1996 | Bertram et al. |
| 5,539,479 A | 7/1996 | Bertram |
| 5,545,857 A | 8/1996 | Lee et al. |
| 5,548,340 A | 8/1996 | Bertram |
| 5,559,961 A | 9/1996 | Blonder |
| 5,585,866 A | 12/1996 | Miller et al. |
| 5,589,893 A | 12/1996 | Gaughan et al. |
| 5,594,469 A | 1/1997 | Freeman et al. |
| 5,594,509 A | 1/1997 | Florin et al. |
| 5,602,597 A | 2/1997 | Bertram |
| 5,604,544 A | 2/1997 | Bertram |
| 5,606,374 A | 2/1997 | Bertram |
| 5,650,827 A | 7/1997 | Tsumori et al. |
| 5,652,630 A | 7/1997 | Bertram et al. |
| 5,659,369 A | 8/1997 | Imaiida |
| 5,677,708 A | 10/1997 | Matthews, III et al. |
| 5,682,489 A | 10/1997 | Harrow et al. |
| 5,721,815 A | 2/1998 | Ottesen et al. |
| 5,721,878 A | 2/1998 | Ottesen et al. |
| 5,742,286 A | 4/1998 | Kung et al. |
| 5,751,883 A | 5/1998 | Ottesen et al. |
| 5,754,258 A | 5/1998 | Hanaya et al. |
| 5,757,358 A | 5/1998 | Osga |
| 5,767,840 A | 6/1998 | Selker |
| 5,768,158 A | 6/1998 | Adler et al. |
| 5,774,186 A | 6/1998 | Brodsky et al. |
| 5,786,805 A | 7/1998 | Barry |
| 5,801,747 A | 9/1998 | Bedard |
| 5,805,235 A | 9/1998 | Bedard |
| 5,808,601 A | 9/1998 | Leah et al. |
| 5,809,265 A | 9/1998 | Blair et al. |
| 5,815,216 A | 9/1998 | Suh |
| 5,825,361 A | 10/1998 | Rubin et al. |
| 5,831,591 A | 11/1998 | Suh |
| 5,831,607 A | 11/1998 | Brooks |
| 5,867,162 A | 2/1999 | O'Leary et al. |
| 5,874,953 A | 2/1999 | Webster et al. |
| 5,898,431 A | 4/1999 | Webster et al. |
| 5,905,496 A | 5/1999 | Lau et al. |
| 5,917,488 A | 6/1999 | Anderson et al. |
| 5,917,489 A | 6/1999 | Thurlow et al. |
| 5,936,623 A | 8/1999 | Amro |
| 5,949,417 A | 9/1999 | Calder |
| 5,956,025 A | 9/1999 | Goulden et al. |
| 5,966,121 A | 10/1999 | Hubbell et al. |
| 5,978,043 A | 11/1999 | Blonstein et al. |
| 5,999,228 A | 12/1999 | Matsuura et al. |
| 6,005,565 A | 12/1999 | Legall |
| 6,008,735 A | 12/1999 | Chiloyan et al. |
| 6,008,860 A | 12/1999 | Patton et al. |
| 6,018,342 A | 1/2000 | Bristor |
| 6,020,930 A | 2/2000 | Legrand |
| 6,052,121 A | 4/2000 | Webster et al. |
| 6,057,841 A | 5/2000 | Thurlow et al. |
| 6,064,376 A | 5/2000 | Berezowski et al. |
| 6,078,308 A | 6/2000 | Rosenberg et al. |
| 6,088,029 A | 7/2000 | Guiberson et al. |
| 6,118,442 A | 9/2000 | Tanigawa |
| 6,118,498 A | 9/2000 | Reitmeier |
| 6,125,374 A | 9/2000 | Terry et al. |
| 6,141,003 A | 10/2000 | Chor et al. |
| 6,147,714 A | 11/2000 | Terasawa et al. |
| 6,173,112 B1 | 1/2001 | Gruse et al. |
| 6,191,773 B1 | 2/2001 | Maruno et al. |
| 6,208,341 B1 | 3/2001 | van Ee et al. |
| 6,208,804 B1 | 3/2001 | Ottesen et al. |
| 6,215,417 B1 | 4/2001 | Krass et al. |
| 6,233,389 B1 | 5/2001 | Barton et al. |
| 6,266,098 B1 | 7/2001 | Cove et al. |
| 6,281,940 B1 | 8/2001 | Sciammarella |
| 6,334,217 B1 | 12/2001 | Kim |
| 6,362,842 B1 | 3/2002 | Tahara et al. |
| 6,493,036 B1 | 12/2002 | Fernandez |
| 6,498,628 B2 | 12/2002 | Iwamura |
| 6,526,577 B1 | 2/2003 | Knudson et al. |
| 6,529,685 B2 | 3/2003 | Ottesen et al. |
| 6,556,252 B1 | 4/2003 | Kim |
| 6,567,109 B1 | 5/2003 | Todd |
| 6,650,248 B1 | 11/2003 | O'Donnell et al. |
| 6,678,009 B2 | 1/2004 | Kahn |
| 6,697,123 B2 | 2/2004 | Janevski et al. |
| 6,750,803 B2 | 6/2004 | Yates et al. |
| 6,750,887 B1 | 6/2004 | Kellerman et al. |
| 6,774,914 B1 | 8/2004 | Benayoun |
| 6,804,824 B1 | 10/2004 | Potrebic et al. |
| 6,816,442 B1 | 11/2004 | Heiman et al. |
| 6,822,698 B2 | 11/2004 | Clapper |
| 6,882,712 B1 | 4/2005 | Iggulden et al. |
| 6,934,963 B1 | 8/2005 | Reynolds et al. |
| 6,943,845 B2 | 9/2005 | Mizutome et al. |
| 7,046,161 B2 | 5/2006 | Hayes |
| 7,061,544 B1 | 6/2006 | Nonomura et al. |
| 7,148,909 B2 | 12/2006 | Yui et al. |
| 7,171,622 B2 | 1/2007 | Bhogal |
| 7,196,733 B2 | 3/2007 | Aratani et al. |
| 7,206,029 B2 | 4/2007 | Cohen-Solal |
| 7,225,456 B2 | 5/2007 | Kitsukawa et al. |
| 7,231,603 B2 | 6/2007 | Matsumoto |
| 7,268,830 B2 | 9/2007 | Lee |
| 7,370,284 B2 | 5/2008 | Andrea et al. |
| 7,420,620 B2 | 9/2008 | Habas et al. |
| 7,434,246 B2 | 10/2008 | Florence |
| 7,440,036 B2 | 10/2008 | Onomatsu et al. |
| 7,584,492 B2 | 9/2009 | Terakado et al. |
| 7,600,201 B2 | 10/2009 | Endler et al. |
| 7,620,966 B2 | 11/2009 | Kitamori |
| 7,636,131 B2 | 12/2009 | Hsieh et al. |
| 7,707,599 B1 | 4/2010 | Groff et al. |
| 7,746,332 B2 | 6/2010 | Le Leannec et al. |
| 7,876,382 B2 | 1/2011 | Imaizumi |
| 7,880,813 B2 | 2/2011 | Nakamura et al. |
| 7,958,460 B2 | 6/2011 | Garrison et al. |
| 8,001,566 B2 | 8/2011 | Jang |
| 8,005,826 B1 | 8/2011 | Sahami et al. |
| 8,239,784 B2 | 8/2012 | Hotelling et al. |
| 8,582,957 B2 | 11/2013 | Taxier et al. |
| 2001/0011953 A1 | 8/2001 | Shintani et al. |
| 2001/0017672 A1 | 8/2001 | Verhaeghe |
| 2001/0044855 A1* | 11/2001 | Vermeire et al. ............ 709/310 |
| 2002/0054062 A1 | 5/2002 | Gerba et al. |
| 2002/0057382 A1 | 5/2002 | Yui |
| 2002/0059599 A1 | 5/2002 | Schein et al. |
| 2002/0060754 A1* | 5/2002 | Takeuchi .................... 348/745 |
| 2002/0070957 A1 | 6/2002 | Trajkovic et al. |
| 2002/0075333 A1 | 6/2002 | Dutta et al. |
| 2002/0075407 A1 | 6/2002 | Cohen-Solal |
| 2002/0097229 A1 | 7/2002 | Rose et al. |
| 2002/0122027 A1 | 9/2002 | Kim |
| 2002/0122079 A1 | 9/2002 | Kamen et al. |
| 2002/0129366 A1 | 9/2002 | Schein et al. |
| 2002/0174430 A1 | 11/2002 | Ellis et al. |
| 2002/0178446 A1 | 11/2002 | Sie et al. |
| 2002/0184629 A1 | 12/2002 | Sie et al. |
| 2002/0191954 A1 | 12/2002 | Beach |
| 2003/0001908 A1 | 1/2003 | Cohen-Solal |
| 2003/0005443 A1 | 1/2003 | Axelsson et al. |
| 2003/0005445 A1 | 1/2003 | Schein et al. |
| 2003/0018973 A1 | 1/2003 | Thompson |
| 2003/0025716 A1 | 2/2003 | Colavin |
| 2003/0066079 A1 | 4/2003 | Suga |
| 2003/0086694 A1 | 5/2003 | Davidsson |
| 2003/0115589 A1 | 6/2003 | D'Souza et al. |
| 2003/0126607 A1 | 7/2003 | Phillips et al. |
| 2003/0131356 A1* | 7/2003 | Proehl et al. ............... 725/58 |
| 2003/0191947 A1 | 10/2003 | Stubblefield et al. |

(56) References Cited

U.S. PATENT DOCUMENTS

| | | |
|---|---|---|
| 2003/0193426 A1 | 10/2003 | Vidal |
| 2003/0208751 A1 | 11/2003 | Kim et al. |
| 2004/0041723 A1 | 3/2004 | Shibamiya et al. |
| 2004/0070593 A1 | 4/2004 | Neely et al. |
| 2004/0107439 A1 | 6/2004 | Hassell et al. |
| 2004/0111744 A1 | 6/2004 | Bae et al. |
| 2004/0168191 A1 | 8/2004 | Jerding et al. |
| 2004/0172651 A1 | 9/2004 | Wasilewski et al. |
| 2004/0189714 A1 | 9/2004 | Fox et al. |
| 2004/0201780 A1 | 10/2004 | Kim |
| 2004/0218905 A1 | 11/2004 | Green et al. |
| 2004/0230843 A1 | 11/2004 | Jansen |
| 2004/0255336 A1 | 12/2004 | Logan et al. |
| 2005/0002649 A1 | 1/2005 | Boyle et al. |
| 2005/0010947 A1* | 1/2005 | Ellis ............................... 725/38 |
| 2005/0010949 A1 | 1/2005 | Ward et al. |
| 2005/0015803 A1 | 1/2005 | Macrae et al. |
| 2005/0076361 A1 | 4/2005 | Choi et al. |
| 2005/0084233 A1 | 4/2005 | Fujii et al. |
| 2005/0128366 A1 | 6/2005 | Cha |
| 2005/0188402 A1 | 8/2005 | de Andrade et al. |
| 2005/0190280 A1 | 9/2005 | Haas et al. |
| 2005/0235226 A1 | 10/2005 | Watanabe et al. |
| 2005/0251826 A1 | 11/2005 | Orr |
| 2005/0268100 A1 | 12/2005 | Gasparini et al. |
| 2006/0037047 A1 | 2/2006 | DeYonker et al. |
| 2006/0051058 A1 | 3/2006 | Rudolph et al. |
| 2006/0061668 A1 | 3/2006 | Ise |
| 2006/0061688 A1 | 3/2006 | Choi |
| 2006/0064700 A1 | 3/2006 | Ludvig et al. |
| 2006/0084409 A1 | 4/2006 | Ghadiali |
| 2006/0095401 A1 | 5/2006 | Krikorian et al. |
| 2006/0184900 A1 | 8/2006 | Ishii et al. |
| 2006/0236342 A1 | 10/2006 | Kunkel et al. |
| 2007/0019111 A1 | 1/2007 | Won |
| 2007/0039019 A1 | 2/2007 | Collier |
| 2007/0039020 A1 | 2/2007 | Cansler, Jr. et al. |
| 2007/0061724 A1 | 3/2007 | Slothouber et al. |
| 2007/0074254 A1 | 3/2007 | Sloo |
| 2007/0079334 A1 | 4/2007 | Silver |
| 2007/0115391 A1 | 5/2007 | Anderson |
| 2007/0130607 A1 | 6/2007 | Thissen et al. |
| 2007/0186231 A1 | 8/2007 | Haeuser et al. |
| 2007/0192791 A1 | 8/2007 | Sullivan et al. |
| 2007/0195197 A1 | 8/2007 | Seong et al. |
| 2007/0199022 A1 | 8/2007 | Moshiri et al. |
| 2007/0266397 A1 | 11/2007 | Lin |
| 2007/0277224 A1 | 11/2007 | Osborn et al. |
| 2008/0010518 A1 | 1/2008 | Jiang et al. |
| 2008/0024682 A1 | 1/2008 | Chen |
| 2008/0034314 A1 | 2/2008 | Louch et al. |
| 2008/0052245 A1 | 2/2008 | Love |
| 2008/0066102 A1 | 3/2008 | Abraham et al. |
| 2008/0074550 A1 | 3/2008 | Park |
| 2008/0088495 A1 | 4/2008 | Kawakita |
| 2008/0129886 A1* | 6/2008 | Ishihara .......................... 348/731 |
| 2008/0147803 A1* | 6/2008 | Krzyzanowski et al. ...... 709/206 |
| 2008/0184324 A1* | 7/2008 | Yun et al. ....................... 725/131 |
| 2008/0222523 A1 | 9/2008 | Fox et al. |
| 2008/0229254 A1 | 9/2008 | Warner |
| 2008/0231762 A1 | 9/2008 | Hardacker et al. |
| 2008/0235735 A1* | 9/2008 | Wroblewski .................... 725/47 |
| 2008/0263595 A1 | 10/2008 | Sumiyoshi et al. |
| 2009/0007209 A1 | 1/2009 | Kawai |
| 2009/0031335 A1 | 1/2009 | Hendricks et al. |
| 2009/0031343 A1 | 1/2009 | Sharkey |
| 2009/0070815 A1 | 3/2009 | Barrett et al. |
| 2009/0141024 A1 | 6/2009 | Lee et al. |
| 2009/0241145 A1 | 9/2009 | Sharma |
| 2009/0327886 A1 | 12/2009 | Whytock et al. |
| 2010/0037180 A1* | 2/2010 | Elias et al. ..................... 715/840 |
| 2010/0050199 A1 | 2/2010 | Kennedy |
| 2010/0071004 A1 | 3/2010 | Wightman |
| 2010/0074592 A1 | 3/2010 | Taxier et al. |
| 2010/0077432 A1 | 3/2010 | VanDuyn et al. |
| 2010/0079671 A1 | 4/2010 | VanDuyn et al. |
| 2010/0083309 A1 | 4/2010 | Whtie et al. |
| 2010/0083310 A1 | 4/2010 | VanDuyn et al. |
| 2010/0083312 A1 | 4/2010 | White et al. |
| 2010/0083313 A1 | 4/2010 | White et al. |
| 2010/0083315 A1 | 4/2010 | White et al. |
| 2010/0083319 A1 | 4/2010 | Martch et al. |
| 2010/0100909 A1 | 4/2010 | Arsenault et al. |
| 2010/0115550 A1 | 5/2010 | Minnick et al. |
| 2010/0118211 A1 | 5/2010 | Carlsgaard et al. |
| 2010/0169958 A1 | 7/2010 | Werner et al. |
| 2010/0231525 A1* | 9/2010 | Chen ............................. 345/173 |
| 2011/0018817 A1* | 1/2011 | Kryze et al. .................. 345/173 |

FOREIGN PATENT DOCUMENTS

| | | |
|---|---|---|
| TW | 200729167 | 8/2007 |
| WO | 0001142 A1 | 1/2000 |
| WO | 0145395 A | 6/2001 |
| WO | 0178054 A1 | 10/2001 |
| WO | 0178383 A2 | 10/2001 |
| WO | 02087243 A | 10/2002 |
| WO | 03043320 A2 | 5/2003 |
| WO | 2006119269 A2 | 11/2006 |
| WO | 2006127211 A2 | 11/2006 |
| WO | 2007015047 A2 | 2/2007 |
| WO | 2008013350 A2 | 1/2008 |

OTHER PUBLICATIONS

International Searching Authority, European Patent Office, "International Search Report and Written Opinion," mailed Dec. 18, 2009; International Application No. PCT/US2009/058456, filed Sep. 25, 2009.

International Searching Authority, European Patent Office, "International Search Report and Written Opinion," mailed Dec. 21, 2009; International Application No. PCT/US2009/058454 filed Sep. 25, 2009.

Anonymous "ZigBee," Wikipedia, the Free Encyclopedia [online], Sep. 26, 2008, XP002558439; retrieved from the Internet: <URL:http://en.wikipedia.org/w/index.php?title=ZigBee&oldid=241085798> [retrieved on Dec. 2, 2009].

USPTO "Non-Final Office Action" mailed Nov. 24, 2010; U.S. Appl. No. 12/242,587, filed Sep. 30, 2008.

USPTO "Non-Final Office Action" mailed Jan. 12, 2011; U.S. Appl. No. 12/241,580, filed Sep. 30, 2008.

USPTO "Non-Final Office Action" mailed Jan. 28, 2011; U.S. Appl. No. 12/236,430, filed Sep. 23, 2008.

USPTO "Non-Final office Action" mailed Feb. 4, 2011; U.S. Appl. No. 12/241,599, filed Sep. 30, 2008.

USPTO "Non-Final Office Action" mailed Feb. 9, 2011; U.S. Appl. No. 12/241,608, filed Sep. 30, 2008.

International Searching Authority, European Patent Office, "International Search Report," mailed Feb. 4, 2010; International Application No. PCT/US2009/058937, filed Sep. 30, 2009.

International Searching Authority, European Patent Office, "International Search Report," mailed Feb. 16, 2010; International Application No. PCT/US2009/057582, filed Sep. 18, 2009.

Wightman, Robert Edward "Methods and Apparatus for Providing Multiple Channel Recall on a Television Receiver," U.S. Appl. No. 12/233,274, filed Sep. 18, 2008.

White, James Matthew et al. "Systems and Methods for Configuration of a Remote Control Device," U.S. Appl. No. 12/241,550, filed Sep. 30, 2008.

White, James Matthew et al. "Systems and Methods for Graphical control of User Interface Features Provided by a Television Receiver," U.S. Appl. No. 12/241,556, filed Sep. 30, 2008.

Vanduyn, Luke et al. "Systems and Methods for Graphical Control of Picture-In-Picture Windows," U.S. Appl. No. 12/241,571, filed Sep. 30, 2008.

White, James Matthew et al. "Systems and Methods for Providing Customer Service Features Via a Graphical User Interface in a Television Receiver," U.S. Appl. No. 12/241,580, filed Sep. 30, 2008.

(56) References Cited

OTHER PUBLICATIONS

Martch, Henry Gregg "Systems and Methods for Automatic Configuration of a Remote Control Device," U.S. Appl. No. 12/242,089, filed Sep. 30, 2008.
White, James Matthew et al. "Systems and Methods for Graphical Control of User Interface Features in a Television Receiver," U.S. Appl. No. 12/241,599, filed Sep. 30, 2008.
Minnick, Danny Jean et al., "Graphical Interface Navigation Based on Image Element Proximity," U.S. Appl. No. 12/609,860, filed Oct. 30, 2009.
White, James Matthew et al. "Systems and Methods for Graphical Adjustment of an Electronic Program Guide," U.S. Appl. No. 12/241,608, filed Sep. 30, 2008.
Vanduyn, Luke et al. "Methods and Apparatus for Presenting Supplemental Information in an Electronic Programming Guide," U.S. Appl. No. 12/235,476, filed Sep. 22, 2008.
Vanduyn, Luke et al. "Methods and Apparatus for Providing Multiple Channel Recall on a Television Receiver," U.S. Appl. No. 12/242,587, filed Sep. 30, 2008.
Taxier, Karen Michelle et al. "Methods and Apparatus for Visually Displaying Recording Timer Information," U.S. Appl. No. 12/235,464, filed Sep. 22, 2008.
Martch, Henry Gregg et al. "Methods and Apparatus for Locating Content in an Electronic Programming Guide," U.S. Appl. No. 12/242,614, filed Oct. 17, 2008.
Taxier, Karen Michelle et al. "Apparatus and Methods for Dynamic Pictorial Image Authentication," U.S. Appl. No. 12/236,430, filed Sep. 23, 2008.
USPTO "Non-Final Office Action" mailed Dec. 21, 2010; U.S. Appl. No. 12/235,476, filed Sep. 22, 2008.
USPTO "Non-Final Office Action" mailed Mar. 31, 2011; U.S. Appl. No. 12/241,556, filed Sep. 30, 2008.
The International Bureau of WIPO "International Preliminary Report on Patentability" mailed Apr. 14, 2011; International Appln. No. PCT/US2009/058236, filed Sep. 24, 2009.
USPTO "Final Office Action" mailed May 13, 2011; U.S. Appl. No. 12/242,587, filed Sep. 30, 2008.
European Patent Office, International Searching Authority, "International Search Report" mailed Nov. 10, 2009; International Appln. No. PCT/EP2009/061499.
USPTO "Non-Final Office Action" mailed Jan. 31, 2011; U.S. Appl. No. 12/233,274, filed Sep. 18, 2008.
Wikipedia, the free encyclopedia, "Dashboard (Software)," Retrieved from the Internet on Oct. 6, 2008, http://en.wikipedia.org/w/index.php?title=Dashboard_(software)&printable=yes.
Nintendo, "Wii Operations Manual System Setup," 2007.
International Searching Authority, European Patent Office, Annex to Form PCT/ISA/206, Communication Relating to the Results of the Partial International Search, mailed Nov. 16, 2009; International Application No. PCT/US2009/057825, filed Sep. 22, 2009.
USPTO "Final Office Action" mailed Jul. 28, 2011; U.S. Appl. No. 12/241,608, filed Sep. 30, 2008.
USPTO "Final Office Action" mailed Aug. 18, 2011; U.S. Appl. No. 12/233,274, filed Sep. 18, 2008.
United States Patent and Trademark Office, Final Office Action for U.S. Appl. No. 12/241,599, dated Aug. 26, 2011.
USPTO "Non-Final Office Action" mailed Jul. 6, 2011; U.S. Appl. No. 12/241,571, filed Sep. 30, 2008.
USPTO "Final Office Action" mailed Jun. 23, 2011; U.S. Appl. No. 12/241,580, filed Sep. 30, 2008.
USPTO "Final Office Action" mailed May 13, 2011; U.S. Appl. No. 12/235,476, filed Sep. 22, 2008.
USPTO "Final Office Action" mailed Oct. 21, 2011; U.S. Appl. No. 12/241,571, filed Sep. 30, 2008.
USPTO "Final Office Action" mailed Oct. 5, 2011; U.S. Appl. No. 12/241,556, filed Sep. 30, 2008.
USPTO "Final Office Action" mailed Oct. 9, 2012 for U.S. Appl. No. 12/235,464, filed Sep. 22, 2008.
USPTO "Final Office Action" mailed Sep. 14, 2012 for U.S. Appl. No. 12/242,587, filed Sep. 30, 2008.
USPTO "Non-Final Office Action" mailed Dec. 6, 2011; U.S. Appl. No. 12/241,580, filed Sep. 30, 2008.
USPTO "Final Office Action" mailed Dec. 7, 2011; U.S. Appl. No. 12/241,599, filed Sep. 30, 2008.
USPTO "Non-Final Office Action" mailed Mar. 7, 2012; U.S. Appl. No. 12/235,464, filed Sep. 22, 2008.
USPTO "Non-Final Office Action" mailed Mar. 22, 2012; U.S. Appl. No. 12/241,556, filed Sep. 30, 2008.
USPTO "Non-Final Office Action" mailed Apr. 17, 2012; U.S. Appl. No. 12/241,608, filed Sep. 30, 2008.
Intellectual Property Office, Office Action for ROC (Taiwan) Patent Application No. 098127906, mailed Oct. 25, 2012.
Intellectual Property Office, Office Action for ROC (Taiwan) Patent Application No. 098127902, mailed Oct. 30, 2012.
USPTO, Notice of Allowance and Fee(s) Due for U.S. Appl. No. 12/241,599, mailed Nov. 6, 2012.
USPTO, Final Office Action in U.S. Appl. No. 12/241,571, mailed Nov. 13, 2012.
USPTO Final Office Action in U.S. Appl. No. 12/609,860, mailed Nov. 13, 2012.
USPTO, Non-Final Office Action in U.S. Appl. No. 12/241,608, mailed Nov. 15, 2012.
USPTO, Non-Final Office Action in U.S. Appl. No. 12/241,556, mailed Dec. 5, 2012.
USPTO, Non-Final Office Action in U.S. Appl. No. 12/235,476, mailed Feb. 12, 2013.
USPTO "Final Office Action" mailed Apr. 25, 2012; U.S. Appl. No. 12/242,614, filed Sep. 30, 2008.
USPTO "Non-Final Office Action" mailed Apr. 24, 2012; U.S. Appl. No. 12/235,476, filed Sep. 22, 2008.
USPTO, "Notice of Allowance and Fee(s) Due" mailed May 7, 2013 for U.S. Appl. No. 12/241,608, filed Sep. 30, 2008.
United States Patent and Trademark Office, Office Action for U.S. Appl. No. 12/242,587, dated Jun. 5, 2012.
USPTO "Final Office Action" mailed Aug. 8, 2012 for U.S. Appl. No. 12/241,556, filed Sep. 30, 2008.
USPTO "Non-Final Office Action" mailed Jun. 28, 2012 for U.S. Appl. No. 12/241,571, filed Sep. 30, 2008.
USPTO "Non-Final Office Action" mailed Jul. 26, 2012 for U.S. Appl. No. 12/609,860, filed Oct. 30, 2009.
USPTO "Final Office Action" mailed Aug. 1, 2012 for U.S. Appl. No. 12/241,608, filed Sep. 30, 2008.
USPTO "Final Office Action" mailed Jul. 17, 2012 for U.S. Appl. No. 12/241,580, filed Sep. 30, 2008.
USPTO "Final Office Action" mailed Aug. 9, 2012 for U.S. Appl. No. 12/235,476, filed Sep. 22, 2008.
USPTO "Final Office Action" mailed Aug. 2, 2012 for U.S. Appl. No. 12/241,599, filed Sep. 30, 2008.
USPTO, "Final Office Action" mailed Jun. 7, 2013 for U.S. Appl. No. 12/241,556.
USPTO, "Office Action" mailed Aug. 9, 2013 for U.S. Appl. No. 12/241,580.
USPTO, "Notice of Allowance and Fee(s) Due" mailed Aug. 14, 2013 for U.S. Appl. No. 12/235,476.
US Patent and Trademark Office, Notice of Allowance, dated Sep. 13, 2013 for U.S. Appl. No. 12/235,464.
US Patent and Trademark Office, Non-Final Office Action, dated Sep. 11, 2013 for U.S. Appl. No. 12/241,556.
US Patent and Trademark Office, Non-Final Office Action, dated Sep. 17, 2013 for U.S. Appl. No. 1/242,587.
US Patent and Trademark Office, Non-Final Office Action, dated Sep. 25, 2013 for U.S. Appl. No. 12/609,860.
USPTO "Non-Final Office Action" mailed Nov. 23, 2011; U.S. Appl. No. 12/242,614, filed Sep. 30, 2008.
U.S. Patent and Trademark Office, Final Office Action, dated Apr. 23, 2014 for U.S. Appl. No. 12/241,556.
U.S. Patent and Trademark Office, Final Office Action, dated Apr. 23, 2014 for U.S. Appl. No. 12/609,860.
US Patent and Trademark Office, Notice of Allowance, mailed Feb. 12, 2014 for U.S. Appl. No. 12/241,580.
U.S. Patent and Trademark Office, Non-Final Office Action, dated Aug. 19, 2014 for U.S. Appl. No. 12/609,860.

* cited by examiner

SYSTEMS AND METHODS FOR GRAPHICAL CONTROL OF SYMBOL-BASED FEATURES IN A TELEVISION RECEIVER

TECHNICAL FIELD

The present invention generally relates to user interfaces in television receiver devices, and more particularly relates to systems and methods for providing graphical adjustment and control of numeric, alphanumeric and/or other symbol-based features provided by a television receiver device.

BACKGROUND

Most television viewers now receive their television signals through a content aggregator such as a cable or satellite television provider. For subscribers to a direct broadcast satellite (DBS) service, for example, television programming is received via a broadcast that is sent via a satellite to an antenna that is generally located on the exterior of a home or other structure. Other customers receive television programming through conventional television broadcasts, or through cable, wireless or other media. Programming is typically received at a receiver such as a "set top box" (STB) or other receiver that demodulates the received signals and converts the demodulated content into a format that can be presented to the viewer on a television or other display. In addition to receiving and demodulating television programming, many television receivers are able to provide additional features. Examples of features available in many modern television receivers include electronic program guides (EPGs), digital or other personal video recorders, "place-shifting" features for streaming received content over a network or other medium, providing customer service information and/or the like.

Generally speaking, viewers interact with the STB or other receiver using some sort of user interface that receives inputs from a remote control or other input device. To change a channel, for example, the viewer typically depresses a "channel up/down" button, manually enters a number of a desired channel on a numeric keypad, and/or selects the new channel using a program guide feature of the receiver. Alternatively, viewers can often seek out programs using an EPG feature provided by the receiver. The EPG generally provides comprehensive lists of programs and associated information, and allows viewers to readily tune to programs currently being shown. Many EPGs also allow viewers to set a recording for a future event, or to take other actions as appropriate.

While conventional interfaces are useful for many purposes, there remains a continual desire for more efficient and intuitive user interfaces to the various features provided by the receiver. In particular, there is a desire to provide convenient access to numeric features (e.g., channel numbers) without using a numeric keypad. It is therefore desirable to create systems and methods for improving the viewer interface to the television receiver. These and other desirable features and characteristics will become apparent from the subsequent detailed description and the appended claims, taken in conjunction with the accompanying drawings and this background section.

BRIEF SUMMARY

According to various exemplary embodiments, systems and methods are provided for graphically providing numeric inputs or other controls a set-top box (STB) or other video receiver.

In various embodiments, a method is provided for graphically controlling symbol-based features in a television receiver configured to present imagery on a display in response to viewer instructions transmitted from a remote control. A keypad image is presented on the display that includes key images corresponding to the symbol-based features. A two-dimensional input is received from the remote control that indicates one of the key images, and imagery on the display is updated in response to the received two-dimensional input.

In further embodiments, a method is provided for selecting a channel in a television receiver configured to present imagery on a display in response to viewer instructions transmitted from a remote control. The method comprises presenting a keypad image on the display, wherein the keypad image comprises a plurality of key images each corresponding to a numeral, receiving a first two-dimensional input from the remote control that indicates at least one of the key images, and presenting an indicator of a television channel having a channel number that at least partially corresponds to the indicated key images in response to the first two-dimensional input, wherein the indicator comprises a remember feature. In response to a second two-dimensional input corresponding to the indicator, the receiver may be tuned to the indicated television channel. Further, in response to the second two-dimensional input corresponding to the remember feature, the television channel indicated by the indicator can be associated with a quick reference feature visible on the imagery presented on the display.

Still other embodiments provide a video receiver for presenting imagery on a display in response to viewer input signals provided from a remote control. The receiver comprises a receiver interface configured to receive an incoming modulated signal, a decoder configured to decode the incoming modulated signal to extract a video signal, a wireless receiver configured to receive the viewer input signals from the remote control, wherein the viewer input is a two-dimensional input, and a processor. The processor is configured to receive the viewer input signals from the wireless receiver and to generate the imagery presented on the display, wherein the imagery comprises a keypad image comprising a plurality of key images each corresponding to a symbol, and wherein the processor is further configured to present an indicator of a television channel having a channel number that at least partially corresponds to the indicated key images in response to the viewer input signals. In response to further two-dimensional input corresponding to the indicator, the processor is further configured to direct the decoder to decode at least a portion of the incoming modulated signal corresponding to the indicated television channel for presentation on the display.

Various other embodiments, aspects and other features are described in more detail below.

BRIEF DESCRIPTION OF THE DRAWING FIGURES

Exemplary embodiments will hereinafter be described in conjunction with the following drawing figures, wherein like numerals denote like elements, and FIG. 1 is a block diagram of an exemplary television receiver system;

DETAILED DESCRIPTION

The following detailed description of the invention is merely exemplary in nature and is not intended to limit the invention or the application and uses of the invention. Furthermore, there is no intention to be bound by any theory presented in the preceding background or the following detailed description.

Generally speaking, the viewer is able to provide numeric, alpha-numeric or other symbol based inputs to a television receiver using two-dimensional or other user interface features. A keypad representing the various symbols is graphically presented on the display, and the viewer is able to interact with the keypad imagery using a cursor or other interface feature that can be moved in response to two-dimensional inputs applied at a touchpad, motion sensor or other sensor device associated with the remote control. In embodiments wherein the remote control includes a touchpad or similar control device but does not include a numeric keypad, for example, a viewer may nevertheless be able to provide numeric (or alphanumeric) inputs to the receiver by directing a cursor presented as part of the on-screen imagery. The cursor may be able to select numbers, letters and/or other features in order to tune channels or perform other tasks as desired. Other conveniences such as quick reference features may be provided as well.

Although the various techniques and systems described herein may be used with any sort of remote control or command equipment, various embodiments may be particularly well suited for use with a remote control that includes a touchpad, directional pad, joystick, trackball, set of directional buttons, motion sensor and/or other feature capable of providing two-dimensional inputs to the receiver. While the discussion herein focuses primarily on entering channel numbers, equivalent concepts could be readily applied to other numeric or alphanumeric features provided by the television receiver. Onscreen keypads may be fashioned to show any number of letters, numbers and/or other symbols (including foreign language symbols), thereby allowing the various principles and concepts presented herein to be applied in a wide variety of settings, applications and embodiments.

Figure 1:
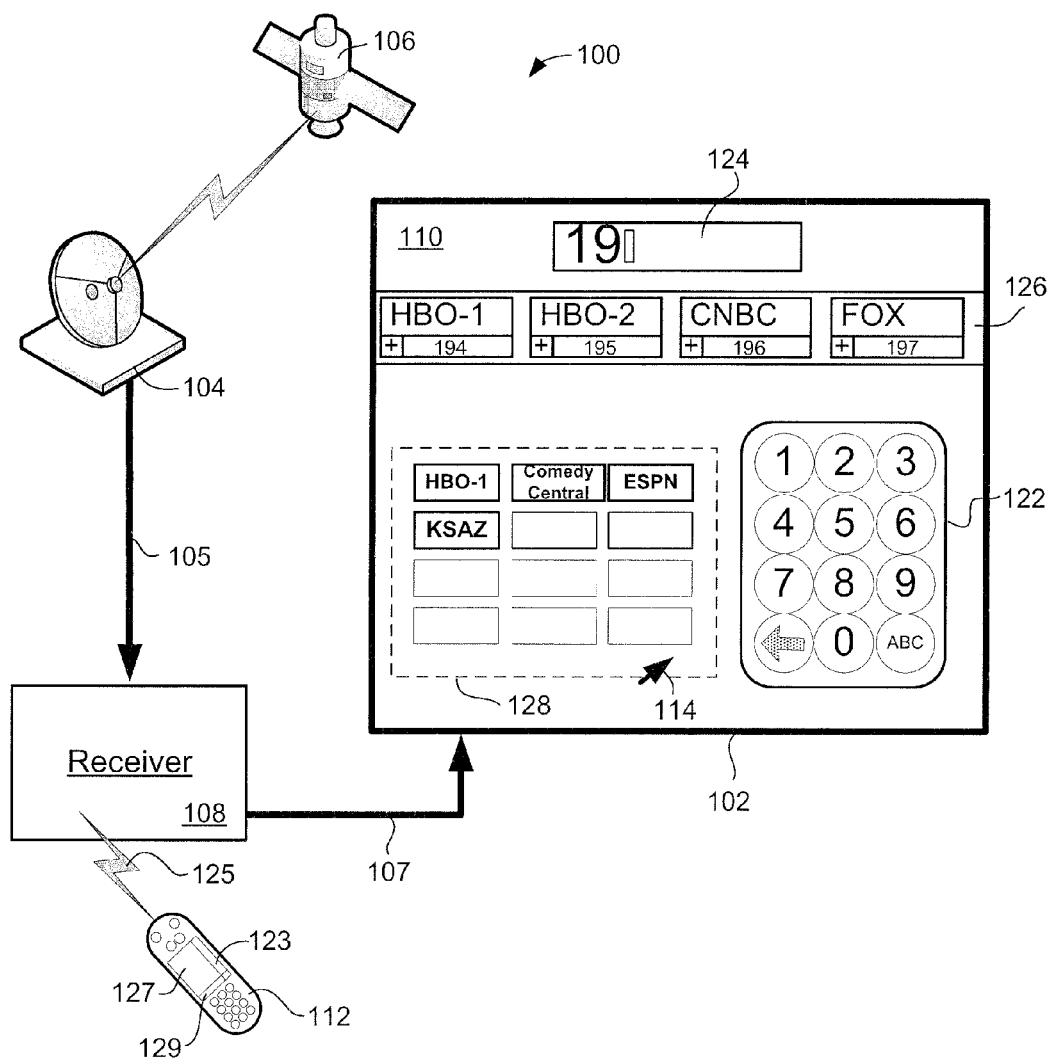

Turning now to the drawing figures and with initial reference to FIG. 1, an exemplary system 100 for presenting television signals to a viewer suitably includes a receiver 108 that receives signals 105 in any format and generates appropriate outputs 107 to generate imagery 110 on display 102. Typically, receiver 108 interacts with signals 125 received from a wireless remote control 112 to present television imagery 110 on display 102 as desired by the viewer.

In the exemplary view shown in FIG. 1, imagery 110 includes a numeric, alphanumeric or other keypad 122 that allows for symbol-based data entry using cursor 114. Imagery 110 also includes a symbol display window 124, a channel indicator window 126, and a quick reference area 128 as desired. The various features presented in imagery 110 may vary widely from embodiment to embodiment. The relative spacing, proportions and locations of the various windows and other features described herein, for example, are entirely exemplary, and may vary widely in other embodiments. Other embodiments may similarly add or omit certain features, or use the various features for purposes other than those described herein.

Television imagery is presented on display 102 as desired by the viewer. Further, two-dimensional navigation features may be presented to allow the viewer to enter symbol-type or other data through control of a cursor 114 or other interface feature via remote control 112. In various embodiments, cursor 114 is able to move in response to two-dimensional input signals 125, which are, in turn, generated in response to inputs applied to two-dimensional input device 124. By moving cursor 114 to interact with the two-dimensional navigation features presented on display 102, numeric, alphanumeric and/or other data may be entered, recalled and/or otherwise manipulated as desired.

Receiver 108 is any component, device or logic capable of receiving and decoding video signals 105. In various embodiments, receiver 108 is a set-top box (STB) or the like capable of receiving satellite, cable, broadcast and/or other signals encoding audio/visual content. Receiver 108 may further demodulate or otherwise decode the received signals 105 to extract programming that can be locally viewed on display 102 as desired. Receiver 108 may also include a content database stored on a hard disk drive, memory, or other storage medium to support a digital or other personal video recorder (DVR/PVR) feature in some embodiments. Receiver 108 may also provide place shifting, electronic program guide, multi-stream viewing and/or other features as appropriate.

In the exemplary embodiment illustrated in FIG. 1, receiver 108 is shown receiving digital broadcast satellite (DBS) signals 105 from a satellite 106 at an antenna 104. Equivalent embodiments, however, could receive programming 105 from one or more programming sources, including any sort of satellite, cable or broadcast source, as well as any Internet or other network source or the like. In embodiments that include DVR functionality, programming may be stored in any sort of database as desired (e.g., in response to user/viewer programming instructions) for subsequent viewing. Content may also be received from digital versatile disks (DVDs) or other removable media in some embodiments.

Display 102 is any device capable of presenting imagery 110 to a viewer. In various embodiments, display 102 is a conventional television set, such as any sort of television operating in accordance with any digital or analog protocols, standards or other formats. Display 102 may be a conventional NTSC or PAL television receiver, for example. In other embodiments, display 102 is a monitor or other device that may not include built-in receiver functionality, but that is nevertheless capable of presenting imagery in response to signal 107 received from receiver 108. In various embodiments, receiver 108 and display 102 may be physically combined or interconnected in any manner. A receiver card, for example, could be inserted into a slot or other interface in a conventional television, or the functionality of receiver 108 may be provided within a conventional television display 102. In other embodiments, signals 107 are transferred between receiver 108 and display 102 using any sort of cable or other interface (including a wireless interface). Examples of common interfaces include, without limitation, component video, S-video, High-Definition Multimedia Interface (HDMI), Digital Visual Interface (DVI), IEEE 1394, and/or any other formats as desired.

Remote control 112 is any sort of control device capable providing signals 125 to receiver 108 that represent inputs received from one or more viewers. Typically, remote control 112 is an infrared, radio frequency (RF) or other wireless remote that includes any number of buttons or other features for receiving viewer inputs. In an exemplary embodiment, remote control 112 communicates with receiver 108 using the IEEE 802.15.4 ("ZIGBEE") protocol for wireless personal area networks (WPANs), although other embodiments may instead communicate using IEEE 802.15.1 ("BLUE-TOOTH"), IEEE 802.11 ("WI-FI"), conventional infrared, and/or any other wireless techniques. In some embodiments, remote control 112 may be able to support multiple types of wireless communication, such as ZIGBEE communications and also infrared communications. This feature may be useful when remote control 112 is a so-called universal remote that is able to provide input signals 125 to multiple devices.

Remote control 112 generally includes any sort of buttons, sliders, rocker switches and/or other features for receiving physical inputs from the viewer. As the user depresses or otherwise interacts with the features, remote control 112 suitably produces wireless signals 125 in response. In further embodiments, remote control 112 includes a two-dimensional input device 124 that is able to receive inputs from the user in any multi-dimensional format (e.g, "X,Y", "r,Θ)", and/or the like). Examples of two-dimensional input devices 124 that could be used in various embodiments include, without limitation, touchpads, directional pads, joysticks, trackballs, sets of arrows or other buttons, and/or the like. In a typical implementation, two-dimensional input device 124 provides coordinates or other signals 125 that indicate absolute (e.g, "X,Y") and/or relative (e.g., "ΔX,ΔY") movement in two or more dimensions. Such signals 125 may be decoded at controller 108 or elsewhere to coordinate the viewer's actions with respect to input device 124 to movement of cursor 114 or other features presented on display 102.

In the exemplary embodiment shown in FIG. 1, remote control 112 is illustrated with a touchpad-type device 124 that accepts viewer inputs applied with a finger, stylus or other object. FIG. 1 also shows touchpad device 124 as having dedicated scroll regions 123 and 128 for vertical and horizontal scrolling, respectively. Viewer movements within region 123 that are more-or-less parallel to the right edge of device 124, for example, could result in vertical scrolling, whereas movements within region 128 that are more-or-less parallel to the bottom edge of device 124 could result in horizontal scrolling. Dedicated scrolling regions 123, 128 are optional features, however, that may not be present in all embodiments. Further, scrolling could be implemented in any other manner.

In operation, then, receiver 108 suitably receives television signals 105 from a satellite, cable, broadcast or other source. In a satellite based embodiment, for example, one or more channels can be extracted from a conventional satellite feed; the video content on the selected channel can be demodulated, extracted and otherwise processed as appropriate to display the desired content to the viewer. One or more cable or broadcast channels may be similarly obtained in any manner. In some embodiments, receiver 108 may obtain multiple channel signals from different sources (e.g., one channel from a cable or satellite source and another channel from a terrestrial broadcast, DVD or other source).

Receiver 108 suitably obtains the desired content from the channel(s) indicated by the viewer, and presents the content on display 102. In various embodiments, viewers are able to further view imagery (e.g., the imagery 110 shown in FIG. 1) that allows for numeric, alphanumeric or other symbol-based inputs to be generated using remote control 112, even though remote control 112 may not have keys or buttons corresponding to some or all of the symbols entered. By moving cursor 114 with respect to imagery 110, for example, a "virtual keypad" can be created that allows symbol-type inputs to be generated. A viewer may enter numerals, for example, by directing cursor 114 toward the desired numeral in keypad 122, and then depressing a select or enter key on the remote 112 to select the indicated symbol. Entered symbols may be displayed or otherwise processed as desired. In the exemplary embodiment shown in FIG. 1, numeric inputs are used to select a television channel to be decoded and presented on display 102. In this embodiment, channel numbers generated with keypad 122 are presented in display window 124, and are also used to select tiles or other indicators in channel indicator window 126. These indicators can be selected (e.g., with cursor 114) to directly tune the indicated channel, or one or more indicated channels may be saved in quick retrieval window 128 for later tuning. Other channel tuning implementations may provide widely varying layouts and features; still other embodiments may use symbol-based inputs for completely different functions, such as searching for programs in an EPG, DVR, network server or other program source, or any other function as desired.

Figure 2:
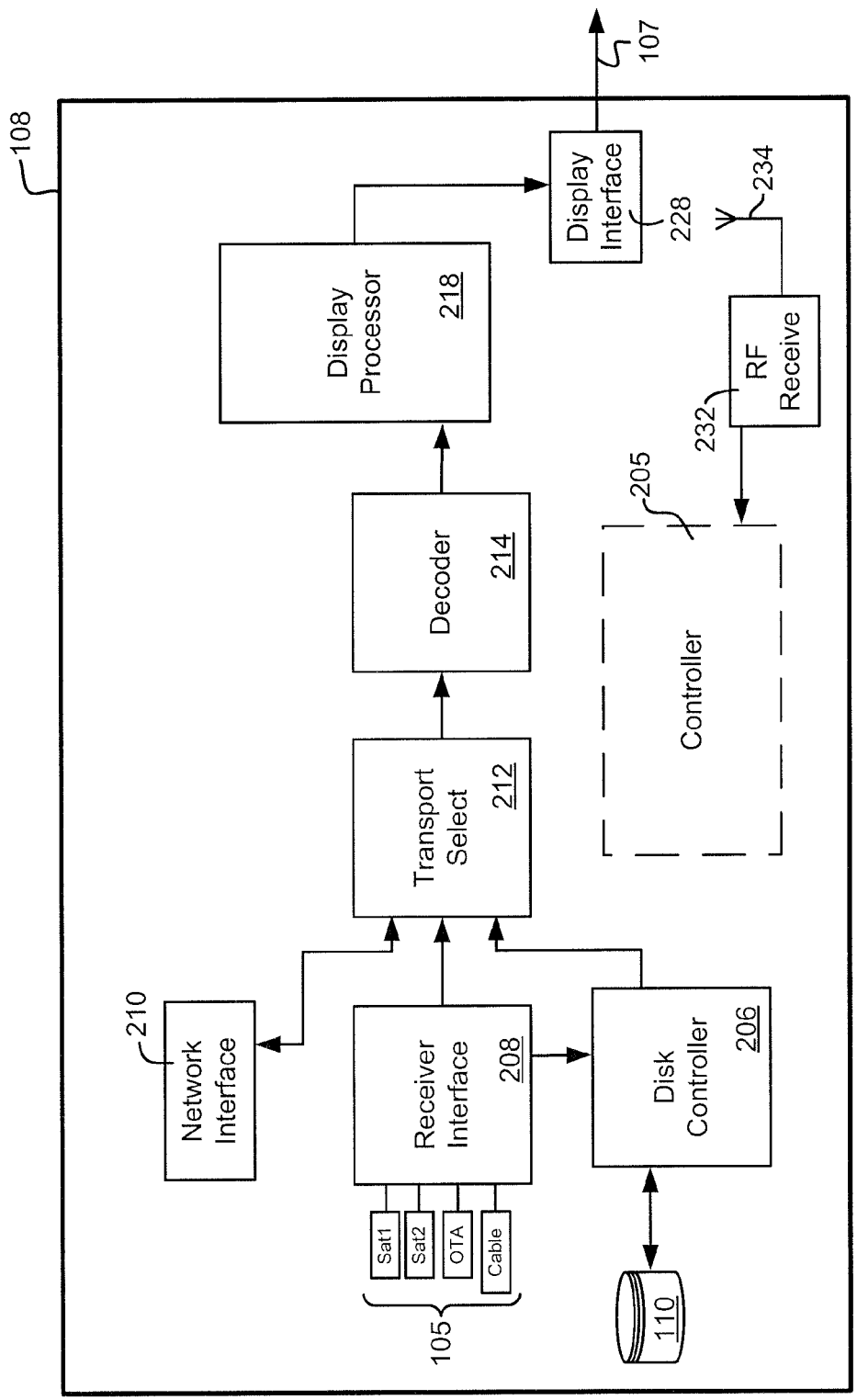
FIG. 2 is a block diagram of an exemplary television receiver device.

FIG. 2 provides additional detail about an exemplary receiver 108 that includes a receiver interface 208, a decoder 214 and a display processor 218, as appropriate. FIG. 2 also shows a disk controller interface 206 to a disk or other storage device 110, an interface 210 to a local or wide area network, a transport select module 212, a display interface 228, an RF receiver module and control logic 205. Other embodiments may incorporate additional or alternate processing modules from those shown in FIG. 2, may omit one or more modules shown in FIG. 2, and/or may differently organize the various modules in any other manner different from the exemplary arrangement shown in FIG. 2.

Receiver 108 may be physically and logically implemented in any manner. FIG. 2 shows various logical and functional features that may be present in an exemplary device; each module shown in the figure may be implemented with any sort of hardware, software, firmware and/or the like. Any of the various modules may be implemented with any sort of general or special purpose integrated circuitry, for example, such as any sort of microprocessor, microcontroller, digital signal processor, programmed array and/or the like. Any number of the modules shown in FIG. 2, for example, may be implemented as a "system on a chip" (SoC) using any suitable processing circuitry under control of any appropriate control logic 205. In various embodiments, control logic 205 executes within an integrated SoC or other processor that implements receiver interface 208, transport selector 212, decoder 214, display processor 218, disk controller 206 and/or other features, as appropriate. The Broadcom Corporation of Irvine, Calif., for example, produces several models of processors (e.g., the model BCM 7400 family of processors) that are capable of supporting SoC implementations of satellite and/or cable receiver systems, although products from any number of other suppliers could be equivalently used. In still other embodiments, various distinct chips, circuits or components may be inter-connected and inter-relate with each other to implement the receiving and decoding functions represented in FIG. 2.

Various embodiments of receiver 108 therefore include any number of appropriate modules for obtaining and processing media content as desired for the particular embodiment. Each of these modules may be implemented in any combination of hardware and/or software using logic executed within any number of semiconductor chips or other processing logic.

Various embodiments of control logic 205 can include any circuitry, components, hardware, software and/or firmware logic capable of controlling the various components of receiver 108. Various routines, methods and processes executed within receiver 108 are typically carried out under control of control logic 205, as described more fully below. Generally speaking, control logic 205 receives user input signals 125 (FIG. 1) via an RF receiver interface 232 that is able to communicate with the remote control 112 using a suitable antenna 234. Control logic receives user inputs from remote control 112 and/or any other source, and directs the other components of receiver 108 in response to the received inputs to present the desired imagery on display 102.

As noted above, receiver 108 suitably includes a receiver interface 208, which is any hardware, software, firmware and/or other logic capable of receiving media content via one or more content sources 105. In various embodiments, content sources 105 may include cable television, direct broadcast satellite (DBS), broadcast and/or other programming sources as appropriate. Receiver interface 208 appropriately selects a desired input source and provides the received content to an appropriate destination for further processing. In various embodiments, received programming may be provided in real-time (or near real-time) to a transport stream select module 212 or other component for immediate decoding and presentation to the user. Alternatively, receiver interface 208 may provide content received from any source to a disk or other storage medium in embodiments that provide DVR functionality. In such embodiments, receiver 108 may also include a disk controller module 206 that interacts with an internal or external hard disk, memory and/or other device that stores content in a database 110, as described above.

In the embodiment shown in FIG. 2, receiver 108 also includes an appropriate network interface 210, which operates using any implementation of protocols or other features to support communication by receiver 108 on any sort of local area, wide area, telephone and/or other network. In various embodiments, network interface 210 supports conventional LAN, WAN or other protocols (e.g., the TCP/IP or UDP/IP suite of protocols widely used on the Internet) to allow receiver 108 to communicate on the Internet or any other network as desired. Network interface 210 typically interfaces with the network using any sort of LAN adapter hardware, such as a conventional network interface card (NIC) or the like provided within receiver 108. Other embodiments may provide interfaces 210 to conventional telephone lines or other communications channels, or may omit network connectivity altogether.

Transport stream select module 212 is any hardware and/or software logic capable of selecting a desired media stream from the available sources. In the embodiment shown in FIG. 2, stream select module 212 is able to generate video signals for presentation on one or more output interfaces 228. Typically, transport select module 212 responds to viewer inputs (e.g., via control logic 205) to simply switch encoded content received from a broadcast, satellite, cable or other source 105 or from storage 110 to one or more decoder modules 214.

Receiver 108 may include any number of decoder modules 214 for decoding, decompressing and/or otherwise processing received/stored content as desired. Generally speaking, decoder module 214 decompresses, decodes and/or otherwise processes received content from stream select module 212 to extract an MPEG or other media stream encoded within the stream. The decoded content can then be processed by one or more display processor modules 218 to create a presentation on display 102 (FIG. 1) for the viewer in any appropriate format. FIG. 2 shows a single decoder module 214 operating on one television signal received from transport select module 212. In practice, any number of decoder modules 214 may be used, particularly in "picture in picture" (PIP) situations when multiple signals are simultaneously decoded and displayed. The term "decoder", then, may collectively apply to one or more decoder modules that are able to decode one or more signals for presentation on display 104.

Display processor module 218 includes any appropriate hardware, software and/or other logic to create desired screen displays via display interface 228 as desired. Such displays may include combining signals received from one or more decoder modules 214 to facilitate viewing of one or more channels. In various embodiments, display processing module 218 is also able to produce on screen displays (OSDs) for electronic program guide, setup and control, input/output facilitation and/or other features that may vary from embodiment to embodiment. Such displays are not typically contained within the received or stored broadcast stream, but are nevertheless useful to users in interacting with receiver 108 or the like. The generated displays, including received/stored content and any other displays may then be presented to one or more output interfaces 228 in any desired format. The various interface features described herein, for example, may be generated by display processor module 218 operating alone or in conjunction with control logic 205.

Display processor 218 may also generate imagery 110 in response to viewer inputs received (and/or in response to instructions from command logic 205) to thereby make up a user interface that allows the viewer select channels or programs, or to perform other tasks as desired. When the viewer provides inputs at keypad 122, indicator window 126 and/or quick reference area 128, for example, display processor 218 may be operable to draw (or redraw) imagery 110 in response, and/or to present television content identified by the viewer, as appropriate. As receiver 108 receives user inputs 125 from remote control 112, control logic 205 may direct display processor 218 to adjust any feature(s) of imagery 110 as directed by the viewer. Display processor 218 therefore directs the presentation of imagery 110 in conjunction with one or more navigation features, and adjusts the imagery 110 in response to inputs received from the viewer.

Display processor 218 produces an output signal encoded in any standard format (e.g., ITU656 format for standard definition television signals or any format for high definition television signals) that can be readily converted to standard and/or high definition television signals at interface 228. In other embodiments, the functionality of display processor 218 and interface 228 may be combined in any manner.

Figure 3:
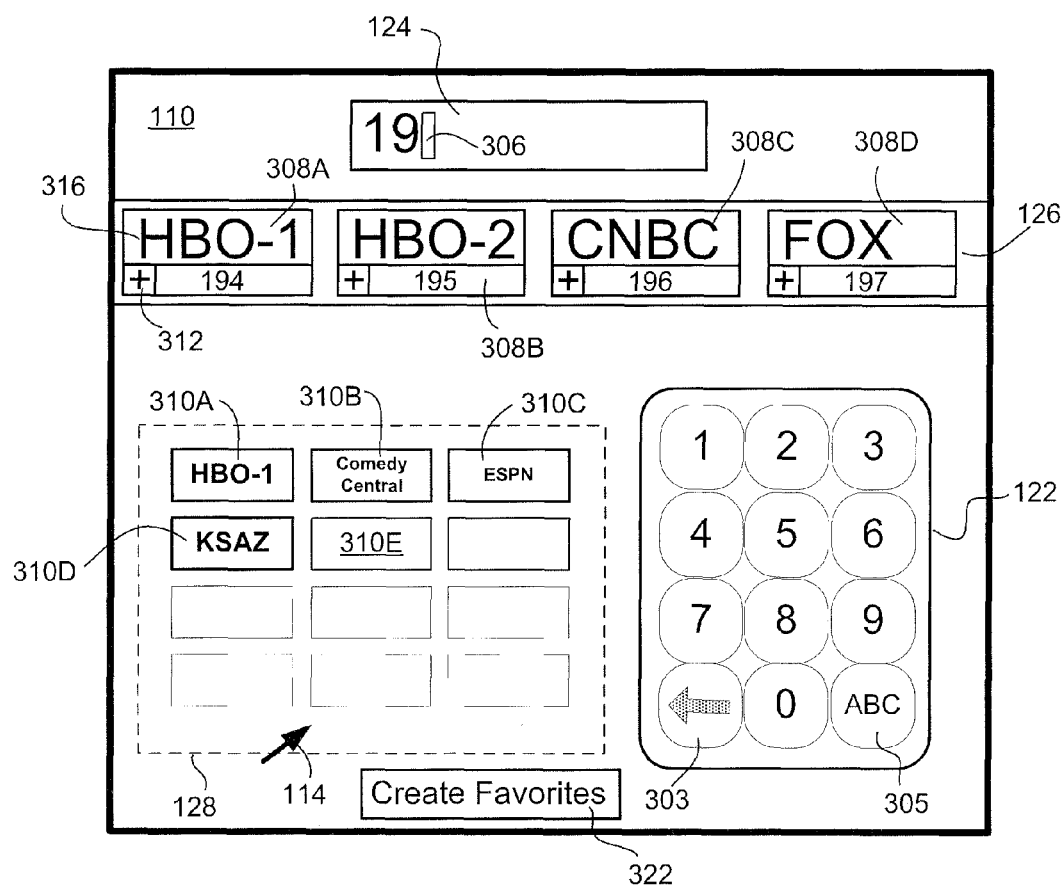
FIG. 3 is a diagram of an exemplary screen display for receiving and processing numeric inputs from the viewer.

FIG. 3 shows an exemplary display 300 that would allow a viewer to provide numeric or other symbol-based inputs using a remote control 112 with two-dimensional input capability. Other embodiments may incorporate imagery 110 of different sizes and configurations, and/or may allow for additional or other features in any manner. Practical views of imagery 110 presented on display 102 may vary widely from that shown in FIG. 3 without departing from the concepts discussed herein.

FIG. 3 shows an exemplary presentation of imagery 110 that includes a keypad 122, a symbol display window 124, a channel indicator window 126, and a quick reference area 128 as appropriate. In the embodiment shown, a viewer is able to move cursor 114 with respect to the various interface features to enter symbolic information using keypad 122, to choose an identifier 308A-B to select a channel, program or other object, and/or to select a "quick reference" feature 301A-E for rapid retrieval of favorite or frequently-used identifiers. The various features shown in FIG. 3 may be implemented using any sort of symbology, programming and/or the like; in an exemplary embodiment, imagery 110 is generated by display processing module 218 (FIG. 2) in response to instructions from the viewer that are relayed by control logic 205.

Keypad 122 is any sort of interface feature capable of support viewer inputs of symbol-based data. In various embodiments, keypad 122 is virtual representation of a numeric, alphanumeric, alphabetical or other keyboard, although other embodiments may support different types of symbols, including foreign language symbols, shapes or other universal access symbols, and/or the like.

Keypad 122 includes any number of key images that each correspond to one or more symbols. In the exemplary embodiment shown in FIG. 3, keypad 122 includes twelve key images corresponding to ten numeric digits (0-9), with two additional key images 303, 305 provided for additional features as desired. Key 305, for example, could be selected to switch to an alphabetical keyboard of any sort. A conventional "QWERTY" or Dvorak-type keyboard could be displayed, for example, or a keypad with fewer key images could be presented, with multiple symbols assigned to each key image. Multiple letters could be assigned to a common key image, for example, and the viewer may be able to enter textual data using multiple "clicks" or other interactions for each key image, in a manner similar to that used for text entry in many conventional mobile phones. Other embodiments may omit alphabetic or alphanumeric entry entirely, or may provide other schemes for receiving alphanumeric data. Key 303 similarly provides any other desired feature. In various embodiments, key 303 may be used to provide a backspace, delete or other feature; other embodiments may use key 303 in a completely different manner, or may omit key 303 entirely.

The viewer provides symbol-based inputs in any manner. In various embodiments, the viewer guides cursor 114 over one or more key images associated with keypad 122 using the touchpad, motion sensor or other two-dimensional feature 124 associated with remote control 112. When the cursor 114 is positioned as desired, the viewer may be able to select the symbol associated with the key image by depressing a "select" or "enter" key, as appropriate. The "select" key may be a button or trigger on remote 112, for example, or may be any other interface feature as desired.

In various embodiments, symbols are presented in display window 124 as the viewer selects symbols in keypad 122. In the exemplary embodiment illustrated in FIG. 3, for example, the viewer has selected digits "1" and "9", and these are shown in window 124. Some embodiments may provide a text cursor 306 that indicates a position in window 124 where symbol data will be entered. Text cursor 306 is shown as a simple horizontal line in FIG. 3, although other embodiments may implement this feature as a static or blinking line, block, rectangle or any other image. Still other embodiments may omit text cursor 306 altogether.

Information entered on keypad 122 and/or displayed in window 124 may be processed in any manner. In various embodiments, the information may be used to select a channel or program for decoding and presentation, for searching a disk, network or the like for content, and/or for any other purpose. In various embodiments, data entered into window 124 can be processed in a predictive manner. In the embodiment shown in FIG. 3, for example, numeric inputs from keypad 122 are used to select a channel to be tuned and presented by receiver 104. As the viewer enters the first few digits of the channel number, imagery 110 may be updated as appropriate to present channels (or other objects) that correspond to the initially-entered data. As the user enters an initial "1", for example, the content of identifier window 126 may be updated to show identifiers 308A-D that begin with 1 (e.g., "1", "10", "100" or the like). In an implementation that uses three-digit channel numbers (100-999), for example, an initial "1" could be result in window 126 showing identifiers 308A-D including channel 100 (corresponding to the beginning of the number range), channel 150 (corresponding to the approximate middle of the channel range), or any other channel as desired. As the viewer enters additional symbols from keypad 122, the additional data may be used to further refine the identifiers 308A-D presented in window 126. After the viewer entered both numerals "1" and "9", for example, window 126 may be updated to show channel identifiers 308A-D associated with channels in the 190-199 range (e.g., channels 194-197, as shown in the example of FIG. 3). Predictive behaviors may be modified in any manner, or omitted in some embodiments.

Identifier window 126 shows any number of identifiers 308A-D for objects that are referenced based upon symbol-based data entered by the viewer. As the viewer selects numeric or other symbolic data from keypad 122, for example, the identifiers 308A-D may be presented and/or updated as desired. Each identifier 308A-D represents any sort of object sought by the viewer; examples of such objects include programs, channels, networks, contents of programs, and/or the like. In the embodiment illustrated in FIG. 3, identifiers 308A-D represent particular channels that can be tuned by receiver 104 for presentation on display 102.

To that end, in various embodiments viewers may be able to immediately select an action associated with any identifier 308A-D by simply selecting that identifier. The viewer may select any identifier 308A-D in any manner. In various embodiments, selection may occur by placing cursor 114 over the identifier 308A-D on imagery 110, and then selecting the identifier 308A-D as appropriate. In the exemplary embodiment shown in FIG. 3, selection of an identifier 308A-D may result in receiver 104 tuning the channel associated with the selected identifier for presentation on display 102. Other actions could include setting a PVR to record a selected program, selecting a program for placeshifting, and/or taking any other action as desired.

In further embodiments, each identifier 308A-D includes a remember feature 312 that allows the receiver 104 to remember the channel or other object identified by the identifier 308A-D for subsequent retrieval. In the exemplary embodiment shown in FIG. 3, remember feature 312 is shown as a plus sign ("+") on a portion of the identifier 308A-D, although other embodiments may use any sort of symbology or imagery for the remember feature 312, and may present the feature 312 at any location on imagery 110.

Subsequent retrieval of remembered objects may be provided in any manner. FIG. 3 shows a quick reference area 128 that includes space for any number of quick reference features 310A-E associated with remembered channel objects 308A-E. As a user clicks on a remember feature 312 on any channel identifier 308 in window 126, for example, a quick reference feature 310A-E is associated with the relevant television channel and placed in area 128. The viewer is then able to quickly tune to the remembered channel by simply clicking on the featured 310A-E associated with the channel in area 128. Again, the features are not limited to quick access to television channels; other remembered features may include programs, networks, files and/or any other objects as desired.

Further, various embodiments may allow the viewer to create a "favorites list" from some or all of the objects 310A-E in quick reference area 128. This list may be available, for example, from an electronic program guide view, or in response to a button or other feature activated on remote control 112. This favorites list may be created automatically or default in some embodiments; in other embodiments, the viewer may activate a button, tile or other feature 322 to create the favorites list. Further, the viewer may be able to create multiple favorites lists in some embodiments by selecting feature 322 with different sets of objects 310A-E in area 128.

That is, the viewer could create a first list by placing a first set of objects 310 in area 128 and then selecting feature 322; that viewer (or another viewer of the same receiver 108) could create another favorites list by placing a different set of objects 310 in area 128 and then selecting feature 322 again. The lists could be named or otherwise identified as appropriate, and used in conjunction with any features (including the EPG) provided by receiver 108.

Figure 4:
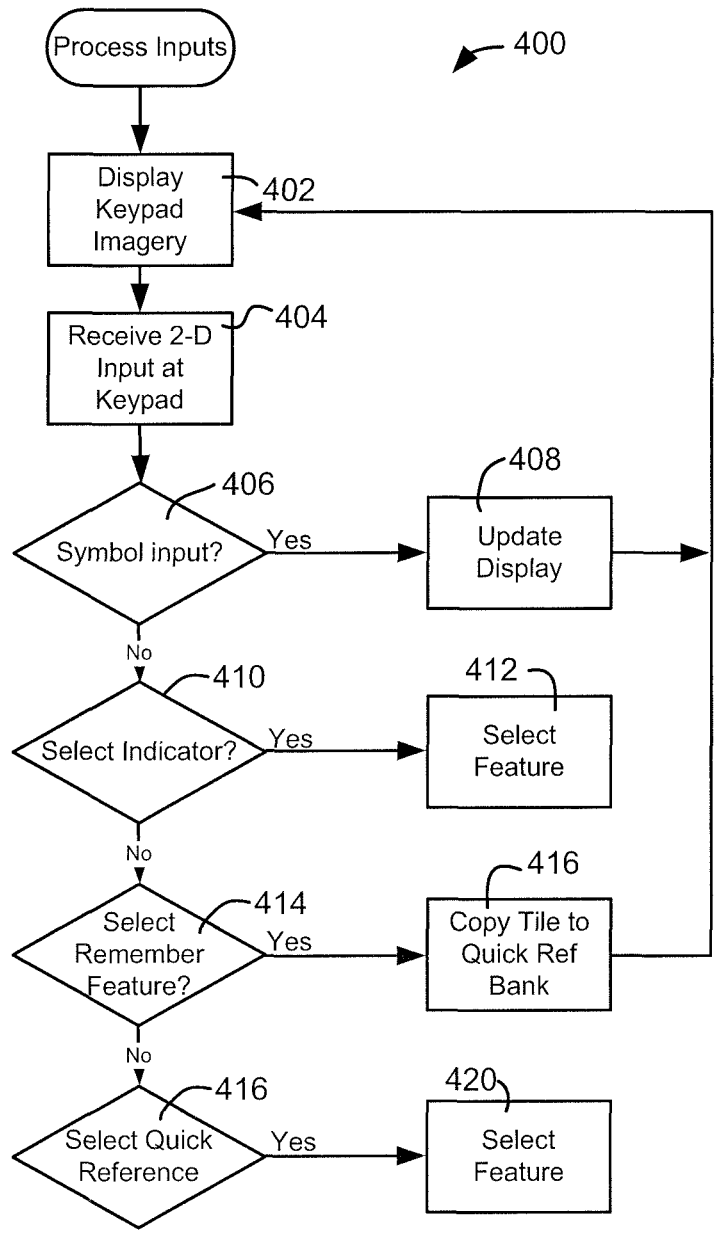
FIG. 4 is a flowchart showing an exemplary process for manipulating numeric values in a television receiver or other device.

FIG. 4 shows an exemplary process 400 for graphically processing symbol-type inputs in a television receiver or the like. In various embodiments, the steps shown in FIG. 4 may be executed using source or object code in any format that may be stored in mass storage, firmware, memory or any other digital storage medium within receiver 104. Such code may be executed by any module or combination of modules operating within receiver 104. In an exemplary embodiment, some or all of the steps shown in process 600 are executed by control logic 205 (FIG. 2) operating alone or in conjunction with a display processing module 218 and/or the various other features shown in FIG. 2 and described above. While FIG. 4 specifically shows a technique for tuning channels on a television receiver, the concepts set forth in the figure and accompanying text could be used to perform other tasks, such as recording programs, selecting programs, searching and/or taking other actions as appropriate. The various steps and actions set forth in FIG. 4 may therefore be supplemented or otherwise modified in any manner.

With reference now to FIG. 4, an exemplary method 400 for processing numeric or other symbol-type data suitably includes the broad steps of displaying a keypad 122 (step 402), receiving inputs from a two-dimensional input device 124 (step 404), and then identifying (steps 406, 410, 414, 418) and processing (steps 408, 412, 416, 420) the received inputs as appropriate to execute the various tasks directed by the viewer. The steps of method 400 may take place in any other temporal order other than that shown in FIG. 4, and/or additional or alternate steps may be provided in alternate embodiments. The actual steps shown in FIG. 4 may be combined or omitted in still other embodiments.

Keypad 122 may be displayed in any manner (step 402). In various embodiments, keypad 122 is any sort of numeric, alphanumeric or other keypad that generated and displayed by display processor 218 (FIG. 2), although other embodiments may generate the keypad in any other manner. As noted above, keypad 122 suitably includes any number of key images each corresponding to one or more letters, numbers and/or other symbols as desired.

Inputs may be received with respect to keypad 122 in any manner (step 404). In various embodiments, receiver 104 receives two-dimensional inputs from remote control 112 relating to a position of a cursor 114, as described above. The viewer is therefore able to position the cursor 114 over one or more key images and then indicate a selection of the key image in any manner.

Symbol input can be identified and processed in any manner (steps 406, 408). In various embodiments, symbol input is recognized from a selected cursor image corresponding to one or more key images in keypad 122. These inputs can be processed in any manner; symbols entered may be displayed (e.g., in window 124 or the like), for example, and/or the symbols may be used to update other portions of imagery 110. Entered numerals, for example, could be used to update the channel indicators 308A-D displayed in window 126, or other features could be provided as appropriate to the particular embodiment.

In various further embodiments, other user interface features may also be provided. In embodiments such as the one shown in FIG. 3, for example, viewer selections of an indicator 308A-D can be identified (step 410) from two-dimensional inputs 125 received from remote 112, as described above. These selections can be processed (step 412) to tune a particular channel or program, or to take some other action as desired.

Some embodiments may provide remember features 312 associated with indicators 308A-D, as described above. In such embodiments, viewer selections of the remember features 312 can be identified (step 414) and processed as desired (step 416). In various embodiments, selection of the remember feature 312 can result in a tile or other indicator 310 being placed in area 128 to allow the feature to be accessed at a later time via a "quick click" on the indicator 310 as appropriate. Upon selection of a quick reference indicator 310 (step 418), any action associated with the referenced feature may be executed (step 420) as desired. A channel may be quickly tuned, for example, or any other action may be taken as desired. As noted above, the objects 310 present in area 128 may be further used to create a quick reference or favorites list that can be accessed from other views (e.g., EPG views) provided by receiver 108, as desired.

Accordingly, new systems and techniques are presented for graphically processing numeric, alphanumeric and/or other symbol-type information. Although the systems and features are generally described herein as applying to processing numeric features, equivalent embodiments could apply the same concepts to alphabetical, alphanumeric and/or any other types of symbol-based information, including selection of programs referenced in an EPG or stored on a DVR, selection of programs from a network host or other source, selection of programs for placeshifting, and/or any other features as desired.

As used herein, the word "exemplary" means "serving as an example, instance, or illustration." Any implementation described herein as exemplary is not necessarily to be construed as preferred or advantageous over other implementations.

While the foregoing detailed description will provide those skilled in the art with a convenient road map for implementing various embodiments of the invention, it should be appreciated that the particular embodiments described above are only examples, and are not intended to limit the scope, applicability, or configuration of the invention in any way. To the contrary, various changes may be made in the function and arrangement of elements described without departing from the scope of the invention.

What is claimed is:

1. A method for graphically controlling symbol-based features in a television receiver configured to present imagery on a display in response to viewer instructions transmitted from a remote control that does not have a numerical keypad, the method comprising:

presenting a numerical keypad image on the display, wherein the keypad image comprises a plurality of key images each corresponding to one of the symbol-based features;

receiving a first input signal from the remote control that does not have a numerical keypad, the first input signal encoding two-dimensional instructions for moving a cursor presented within the imagery on the display to thereby indicate one of the key images and for selecting the one of the key images, wherein the first input signal is received from the remote control independent of an orientation of the remote control with respect to the television receiver; and updating the imagery on the display in response to the received two-dimensional input indicating and selecting one or more of the key images using the cursor, wherein the updating comprises:

identifying each television channel that has a channel number that partially, but not fully, corresponds to the selected one or more of the key images and presenting an indicator for each television channel of a subset of the identified television channels having a channel number that partially, but not fully, corresponds to the selected one or more of the key images, wherein the indicator comprises a remember feature;

receiving a second input signal from the remote control that does not have a numerical keypad, the second input signal encoding two-dimensional instructions for moving the cursor presented within the imagery on the display to thereby indicate the indicator of the television channel and for selecting the indicator of the television channel, and, in response to receiving the second input signal corresponding to the indicator of the television channel, tuning the receiver to the indicated television channel; and receiving a third input signal from the remote control that does not have a numerical keypad, the second input signal encoding two-dimensional instructions for moving the cursor presented within the imagery on the display to thereby indicate a selection of the remember feature, and in response to the third input signal corresponding to the remember feature, associating the television channel indicated by the indicator with a quick reference feature visible on the imagery presented on the display that allows direct subsequent access to the television channel indicated by the indicator via the quick reference feature, the quick reference feature being displayed in a quick reference area comprising a plurality of other quick reference features, the quick reference features comprising short-cut buttons to favorite channels, wherein receiving the first input signal, updating the imagery, receiving the second input signal, and receiving the third input signal are performed while the display simultaneously presents each of the numerical keypad image, numbers corresponding to the selected one or more of the key images, the indicators for each television channel of the subset of the identified television channels, the remember feature, the quick reference feature, and the quick reference area.

2. The method of claim 1 further comprising receiving a further two-dimensional input corresponding to the quick reference feature, and tuning the television channel indicated by the quick reference feature in response to the third two-dimensional input.

3. The method of claim 1 further comprising providing a list of channels for subsequent reference based upon the television channels associated with the quick reference feature.

4. The method of claim 3 wherein the list of channels is accessible from an electronic program guide feature provided by the receiver.

5. The method of claim 1 wherein the two-dimensional input corresponds to a position of a cursor image presented on the display.

6. The method of claim 1 wherein the remote control that does not have a numerical keypad is one of the group consisting of: a touchpad, a trackball, a joystick, and a directional pad.

7. A video receiver for presenting imagery on a display in response to first, second, and third viewer input signals encoding two-dimensional information provided from a remote control that does not have a numerical keypad, the receiver comprising:

a receiver interface configured to receive an incoming modulated signal;

a decoder configured to decode the incoming modulated signal to extract a video signal;

a wireless receiver configured to receive the viewer input signals from the remote control that does not have a numerical keypad, wherein the input signals are received from the remote control independent of an orientation of the remote control with respect to the video receiver; and a processor configured to receive the viewer input signals encoding two-dimensional information from the wireless receiver and to generate the imagery presented on the display, wherein in response to the first view input signal corresponding to a selection of one or more numerical key images of a numerical keypad display the processor is configured to identify identifies each television channel that has a channel number that partially, but not fully, corresponds to a selected one or more of the numerical key images, wherein the processor further presents an indicator for each television channel of a subset of the identified television channels having a channel number that partially, but not fully, corresponds to the indicated key images in response to the viewer input signals, and wherein, in response to the second viewer two-dimensional input signal corresponding to the indicator, the processor directs the decoder to decode at least a portion of the incoming modulated signal corresponding to the indicated television channel for presentation on the display, and wherein the indicator comprises a remember feature and wherein the processor, in response to the third viewer input signal corresponding to the remember feature, associates the television channel indicated by the indicator with a quick reference feature visible on the imagery presented on the display, the quick reference feature being displayed in a quick reference area comprising a plurality of other quick reference features, the quick reference features comprising short-cut buttons to favorite channels, wherein the wireless receiver receives each of the first, second, and third viewer input signals while the display simultaneously presents each of the numerical key images, numbers corresponding to the selected one or more of the key images, the indicators for each television channel of the subset of the identified television channels, the remember feature, the quick reference feature, and the quick reference area.

8. The video receiver of claim 7 wherein the receiver interface comprises a satellite interface.

9. The video receiver of claim 7 wherein the receiver interface comprises a cable interface.

10. The video receiver of claim 7 wherein the remote control that does not have a numerical keypad is one of the group consisting of: a touchpad, a trackball, a joystick, and a directional pad.

11. The video receiver of claim 7 wherein the processor is further configured to direct the decoder to decode at least the portion of the television channel indicated by the quick reference feature in response to a third viewer input signal.

12. The video receiver of claim 7 wherein the quick reference feature is visible within an electronic program guide feature provided by the video receiver.

13. The method of claim 1, wherein the input signal is generated at the remote control in response to a movement input to a touchpad, a trackball, a joystick, or a directional pad integrated within the remote control.

* * * * *